(12) United States Patent
Bussmann et al.

(10) Patent No.: US 8,261,173 B2
(45) Date of Patent: Sep. 4, 2012

(54) CALIBRATION METHOD AND CIRCUIT FOR AN ADD-COMPARE-SELECT LOOP

(75) Inventors: Matthias Bussmann, Los Angeles, CA (US); Salam Elahmadi, Dallas, TX (US)

(73) Assignee: Menara Networks, Inc., Dallas, TX (US)

( * ) Notice: Subject to any disclaimer, the term of this patent is extended or adjusted under 35 U.S.C. 154(b) by 798 days.

(21) Appl. No.: 12/432,609

(22) Filed: Apr. 29, 2009

(65) Prior Publication Data

US 2010/0281348 A1    Nov. 4, 2010

(51) Int. Cl.
*G06F 11/00* (2006.01)

(52) U.S. Cl. ........................... 714/796; 714/795

(58) Field of Classification Search .......... 714/796, 714/797, 795; 398/7, 14, 34
See application file for complete search history.

(56) References Cited

U.S. PATENT DOCUMENTS

| | | | |
|---|---|---|---|
| 6,504,882 B1 * | 1/2003 | Kim | 375/341 |
| 6,697,204 B2 * | 2/2004 | Cyrusian | 360/51 |
| 7,580,454 B2 * | 8/2009 | Carrer et al. | 375/233 |
| 7,623,797 B2 * | 11/2009 | Crivelli et al. | 398/208 |
| 2008/0226301 A1 * | 9/2008 | Alic et al. | 398/158 |

* cited by examiner

*Primary Examiner* — Dieu-Minh Le
(74) *Attorney, Agent, or Firm* — Blakely, Sokoloff, Taylor & Zafman LLP

(57) ABSTRACT

One embodiment of the invention features a programmable gain stage in analog update circuitry to overcome the accuracy limitation of the circuit gain and the maintenance of small finite number of possible sequence estimates.

13 Claims, 3 Drawing Sheets

CALIBRATION METHOD AND CIRCUIT FOR AN ADD-COMPARE-SELECT LOOP

FIELD

Embodiments of the invention generally relate to optical data links including wavelength division multiplexing (WDM) fiber optic transmitters, receivers and transceivers. Particularly, embodiments of the invention relate to an implementation of the Viterbi Algorithm using high-speed analog signal processing.

GENERAL BACKGROUND

Electronic dispersion compensation has become a key feature in fiber-optic communication systems enabling larger tolerance to optical transmission impairments caused by chromatic and polarization mode dispersion effects. One of the most powerful techniques to electronic dispersion compensation is based on the Maximum-Likelihood-Sequence-Estimation (MLSE) algorithm. In practice, most MLSE implementations are based on the Viterbi algorithm.

The circuit implementation of the Viterbi algorithm at high data rates such as 10 Gb/s poses a particular challenge. The Viterbi algorithm relies on recursion that requires at-speed real-time computations that are extremely difficult to perform in a cycle time in the order of 100 ps (pico-seconds) while maintaining the accuracy required to achieve large dispersion tolerances paired with satisfactory bit error rate.

Existing techniques for high-speed MLSE electronics dispersion compensation are typically using an analog-to-digital converter front-end with most of the signal processing performed in the digital domain. Since current semiconductor technology does not allow at-speed computations with the required precision, the data out of the analog-to-digital converter is parallelized and rate-reduced. The standard Viterbi recursion loop is unfolded and a limited number of recursions are performed on a window of the data sequence in a massive parallel effort. This approach limits the accuracy to the achievable analog-to-digital converter speed/resolution and the length of the data sequence window.

The application for the current invention is an implementation of the Viterbi algorithm for optical fiber communications that is suited for at-speed implementation of the recursion loop by keeping the majority of the high-speed signal processing in the analog domain. This analog signal processing approach can yield improved accuracy and reduced circuit complexity making this technique suitable for integration into low-power pluggable optical transceiver modules while providing superior levels of dispersion compensation and optical receiver sensitivity.

One of the key aspects of achieving high analog accuracy is proper calibration of the analog signal processing circuitry. The current invention describes a calibration technique that overcomes the accuracy obstacles in an analog Viterbi recursion loop implementation.

BRIEF DESCRIPTION OF THE DRAWINGS

Features and advantages of embodiments of the invention will become apparent from the following detailed description in which.

DETAILED DESCRIPTION

Embodiments of the invention set forth in the following detailed description generally relate to methods, apparatus, software, and systems for mitigating the distortions, both linear and nonlinear, that affect light pulses as they propagate over an optical fiber medium.

The embodiments of the invention are directed to a system-on-a-chip implementation that is designed to compensate a signal for chromatic and polarization mode dispersive effects realized by an optical device. Of course, the invention may be utilized in other implementations besides system-on-a-chip.

In the following description, certain terminology is used to describe certain features of the invention. For instance, the term "block" is used to describe a circuitry that collectively performs a particular function. An "optical device" is a device that transmits and/or receives light pulses for communication purposes.

Dispersive effects in optical fiber communication systems most commonly cause broadening of the light pulses received from an optical fiber that result in inter-symbol interference (ISI). The magnitude of such ISI varies but can in many cases encompass several unit intervals (UI).

The received optical signal is converted into an electrical signal in an opto-electrical converter (OE) and fed into an electrical filter block. This electrical filter normalizes the ISI included in the signal to a predetermined amount to match the target of the Viterbi detector. The electrical filter may include both continuous-time and sampled-time sections and yields an analog sampled-time output signal.

The Viterbi decoder block comprises Add-Compare-Select (ACS) and Survival-Sequence-Register (SSR). The ACS block contains the time- and precision-critical recursion loop of the Viterbi algorithm and is one element of the invention.

The Viterbi algorithm achieves a maximum likelihood sequence estimate by maintaining a small finite number of possible sequences and continuously computing the likelihood of any of the sequences being the most likely one received while discarding unlikely sequences. The common hardware implementation consists of the ACS performing branch and path metric calculations and the SSR maintaining/selecting the candidate sequences.

The branch metric calculations determine the Euclidian distance between an actual incoming data point and the expected data points. For a common implementation that can correct for ISI of up to several UI, 5 receive levels are obtained.

Figure 1:
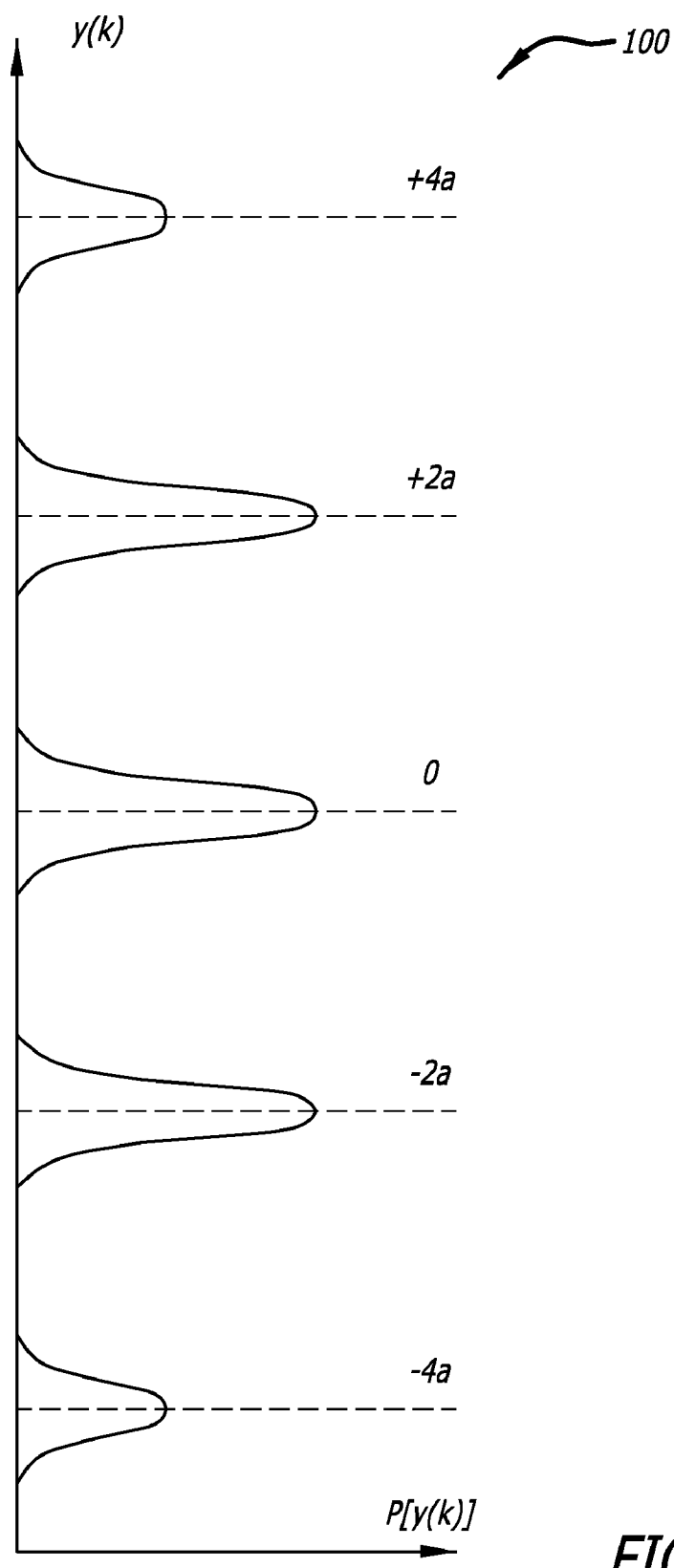
FIG. 1 illustrates the distribution of the sampled representation of the received end equalized signal for a 5-level Viterbi detector.

FIG. 1 shows the probability distribution of the 5 receive levels. A four-state Viterbi detector is suitable to decode a 5-level signal y(k) 100 at time k. The peak-to-peak amplitude of the sampled signal is equal to 8a, where "a" is the amplitude of the signal y(k). The following set of equations describes the metric updates while going from cycle k to cycle k+1, where "k" is an integer. The metrics $M_i(k)$ are a measure of the likelihood of each of the four states i, where i can assume the values 0 to 3 as shown in Table A. $M_{avg}(k)$ is the average of the metric values $M_i(k)$. The lower the metric value, the more likely a particular state represents the received signal.

TABLE A $$M_0(k+1) = \min(M_0(k) + 2y(k) + 4a, M_1(k) + y(k) + a) - M_{avg}(k)$$
$$M_1(k+1) = \min(M_2(k), M_3(k) - y(k) + a) - M_{avg}(k)$$
$$M_2(k+1) = \min(M_0(k) + y(k) + a, M_1(k)) - M_{avg}(k)$$
$$M_3(k+1) = \min(M_2(k) - y(k) + a, M_3(k) - 2y(k) + 4a) - M_{avg}(k)$$

The above formulas may be modified and rearranged in a particular circuit embodiment to ease implementation within the requirements of a particular circuit technology.

As can be seen in the above equations, the cycle-to-cycle update procedure has to follow precise operational constraints. Any small deviation from the described updates will result in a performance degradation of the Viterbi decoder.

The analog implementation of the above recursion equations raises the special problem of maintaining exact multiples of the metrics $M_i(k)$, the incoming signal $y(k)$ and the amplitude a. While good relative accuracy can be achieved through component matching techniques, the absolute magnitude of the update value is dependent on many parameters that are hard to control over process, temperature, and power supply voltage variations. To model this effect, a variable "b" can describe the effect of the gain non-ideality that is reasonably matched between the four update equations as shown below in Table B. This variable is usually relatively close to unity.

TABLE B $$M_0(k+1) = b * \min(M_0(k) + 2y(k) + 4a, M_1(k) + y(k) + a) - M_{avg}(k)$$
$$M_1(k+1) = b * \min(M_2(k), M_3(k) - y(k) + a) - M_{avg}(k)$$
$$M_2(k+1) = b * \min(M_0(k) + y(k) + a, M_1(k)) - M_{avg}(k)$$
$$M_3(k+1) = b * \min(M_2(k) - y(k) + a, M_3(k) - 2y(k) + 4a) - M_{avg}(k)$$

The current invention is introducing a programmable gain stage in the analog update circuits to overcome the accuracy limitation of the circuit gain by multiplying all update equations by a factor theoretically equal to 1/b which yields the original set of metric equations.

Figure 2:
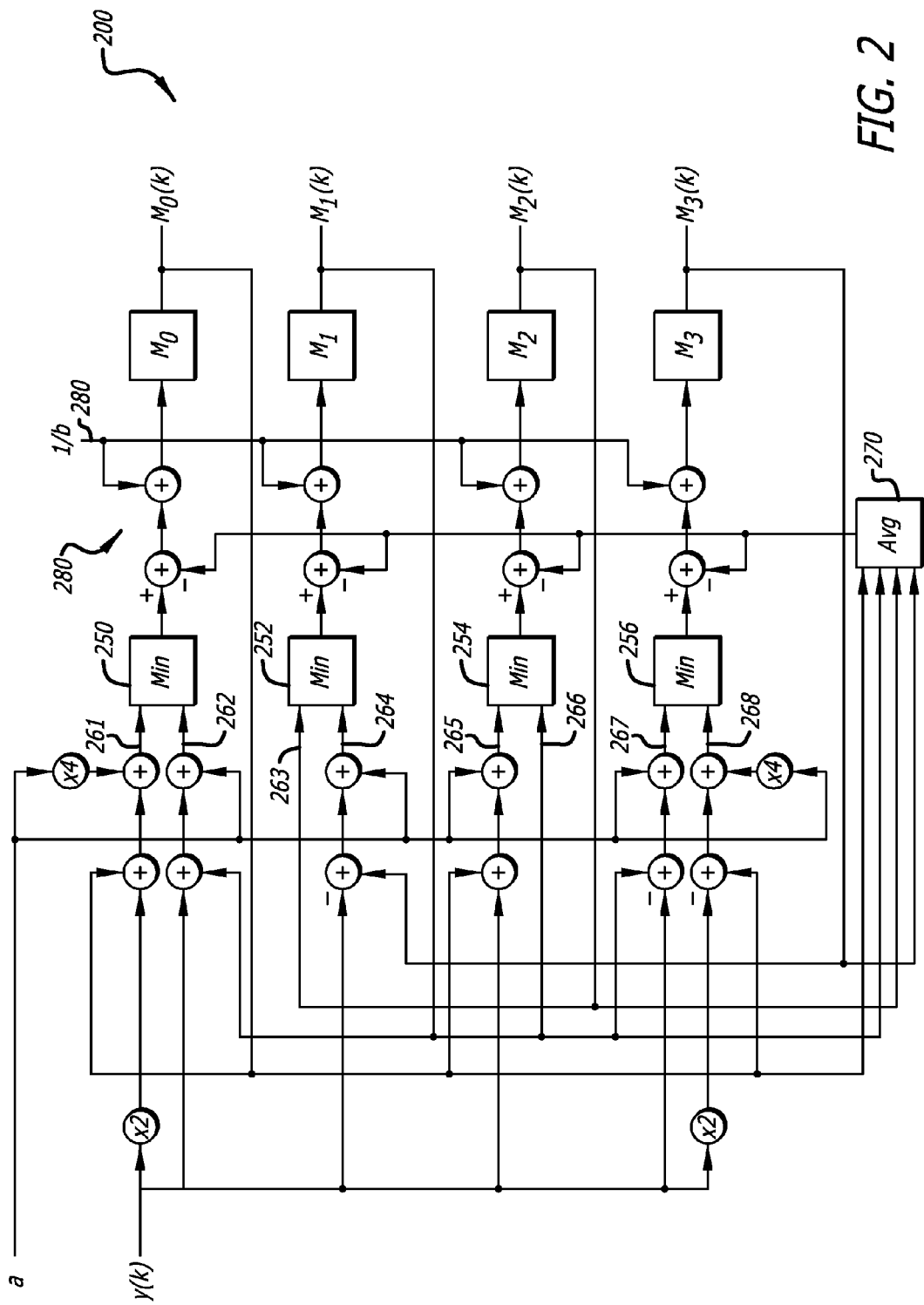
FIG. 2 is a block diagram of an exemplary embodiment of the analog Add-Compare-Select block with the analog calibration circuit.

FIG. 2 shows the block diagram of the ACS 200 with computations being performed by circuitry within ACS 200. First, eight sum terms 261-268 produced as results from adders and/or logic circuitry are formed from the metrics, the input signal and the amplitude reference. Then, circuitry computing the minimum 250, 252, 254 and 256 from two sum terms 261-262, 263-264, 265-266 and 267-268 for each metric and the average 270 of all metrics is subtracted. The result is forwarded to the gain calibration stage 280 which multiplies all new metric values by a constant factor 282 of 1/b. The products are fed into the analog metric storage elements $M_1$-$M_3$ representing the new updated metric values.

Figure 3:
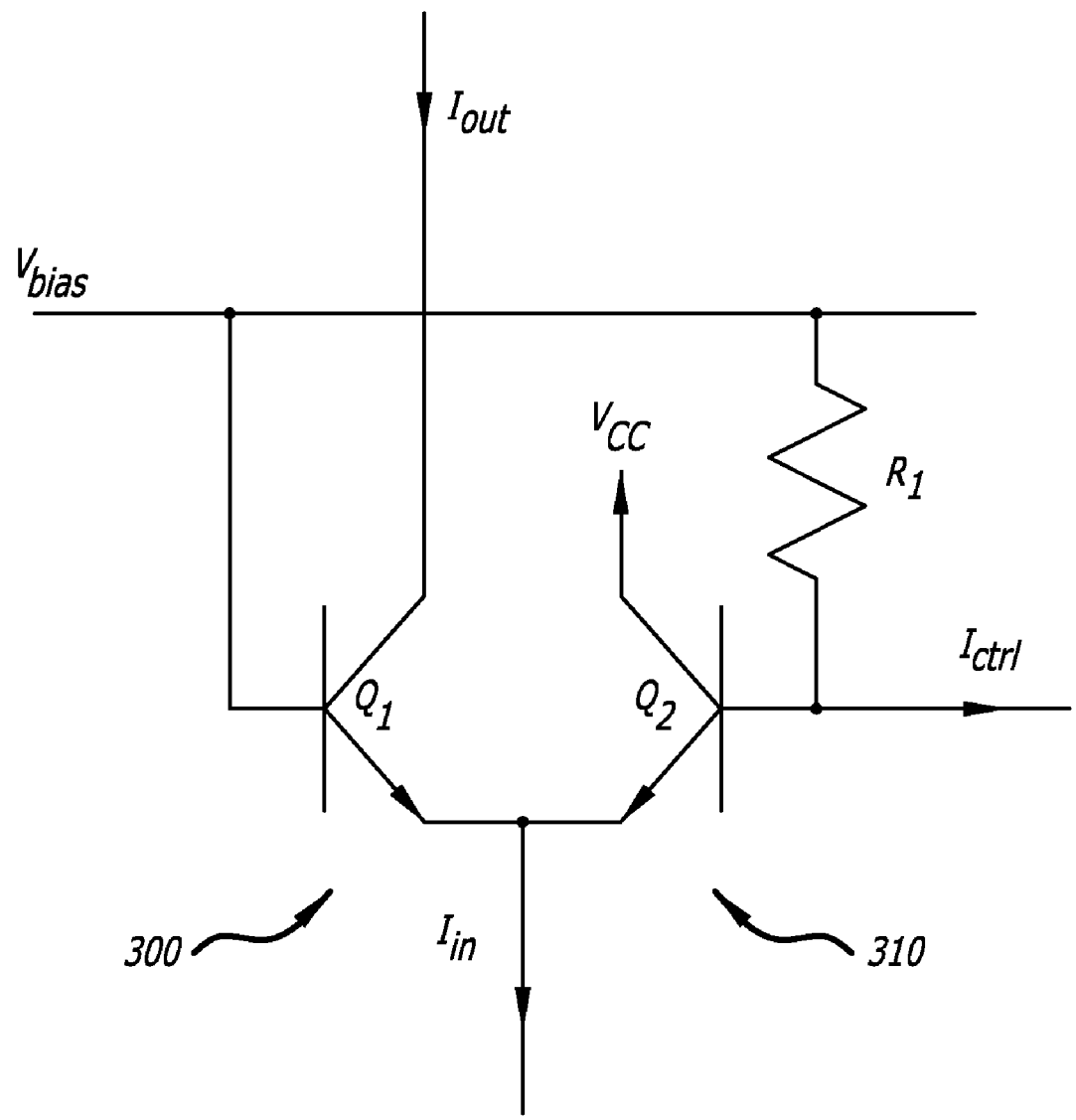
FIG. 3 illustrates an embodiment of the analog calibration circuit for the Add-Compare-Select block.

FIG. 3 describes one of the possible embodiments of gain calibration stage 282. All input and output signals are currents. "$I_{in}$" is the input current representing the output of the minimum circuit block with subtracted metric average. A control current $I_{ctrl}$ allows the subtraction of a variable portion of the current $I_{in}$. The larger the control current $I_{ctrl}$ the less current is subtracted from $I_{in}$ and steered to the positive supply voltage $V_{CC}$. The larger the control current the larger the ratio $I_{out}/I_{in}$ which represents the gain of the calibration stage. The gain of the calibration stage is normally smaller than unity. To yield unity gain, the current $I_{in}$ is scaled to compensate the losses through the gain calibration stage when the bases of $Q_1/Q_2$ are biased mid-scale.

In a specific embodiment of the gain calibration stage, the areas of transistors $Q_1$ 300 and $Q_2$ 310 are chosen such that $Q_1$ much larger than $Q_2$. In this case only a relatively small portion of the current $I_{in}$ is steered to the positive supply $V_{CC}$.

Let $A_1$ be the area of transistor $Q_1$ 300 and $A_2$ be the area of transistor $Q_2$ 310. Neglecting the transistor current gain, the input current $I_{in}$ should be scaled by a factor of $(A_1+A_2)/(A_1+A_2/2)$ to compensate the mid-scale gain calibration stage losses.

While the invention has been described in terms of several embodiments, the invention should not be limited to only those embodiments described, but can be practiced with modification and alteration within the spirit and scope of the appended claims.

What is claimed is:

1. An apparatus comprising:
    a first circuit to compute a first metric at a second cycle ($M_0(k+1)$) by taking a first minimum of (1) a sum of a first metric at a first cycle ($M_0(k)$), a multiple of an incoming signal ($y(k)$) and a multiple of an amplitude of the incoming signal, and (2) a sum of a second metric at a first cycle ($M_1(k)$), the incoming signal and the amplitude of the incoming signal;
    a second circuit to compute the second metric at a second cycle ($M_1(k+1)$) by taking a second minimum of (1) a sum of a third metric at the first cycle ($M_3(k)$), and (2) a sum of a fourth metric at a first cycle ($M_3(k)$) and the amplitude of the incoming signal subtracting the incoming signal;
    a third circuit to compute the third metric at a second cycle ($M_2(k+1)$) by taking a third minimum of (1) a sum of the first metric at the first cycle ($M_0(k)$), the incoming signal and the amplitude, and (2) the second metric at the first cycle ($M_1(k)$);
    a fourth circuit to compute a fourth metric at a second cycle ($M_3(k+1)$) by taking a fourth minimum of (1) a sum of the first metric at the first cycle ($M_0(k)$), the incoming signal ($y(k)$) and the amplitude of the incoming signal, and (2) a sum of a fourth metric at a first cycle ($M_3(k)$) and a multiple of the amplitude of the incoming signal subtracting a multiple of the incoming signal; and
    a substractor to substract an average of the first metric, the second metric, the third metric and the fourth metric at the first cycle.

2. The apparatus of claim 1, wherein the multiple of the incoming signal for computing the first metric at the second cycle is equal to 2.

3. The apparatus of claim 2, wherein the multiple of the amplitude for computing the first metric at the second cycle is equal to 4.

4. The apparatus of claim 1, wherein the multiple of the incoming signal for computing the fourth metric at the second cycle is equal to 2.

5. The apparatus of claim 2, wherein the multiple of the amplitude for computing the fourth metric at the second cycle is equal to 4.

6. The apparatus of claim 1, wherein the first circuit computing the first metric at the second cycle ($M_0(k+1)$) by further multiplying the first minimum by a constant factor.

7. The apparatus of claim 6, wherein the second circuit computing the second metric at the second cycle ($M_1(k+1)$) by multiplying the second minimum by the constant factor.

8. The apparatus of claim 7, wherein the third circuit computing the third metric at the second cycle ($M_2(k+1)$) by multiplying the third minimum by the constant factor.

9. The apparatus of claim 8, wherein the fourth circuit computing the fourth metric at the second cycle ($M_3(k+1)$) by multiplying the fourth minimum by the constant factor.

10. The apparatus of claim 1 being an Add-Compare-Select (ACS) circuit implemented within a detector of an optical device.

11. A circuit comprising:
a first circuit to compute a first metric defined by $b*\min(M_0(k)+2y(k)+4a, M_1(k)+y(k)+a)-M_{avg}(k)$, where "b" is a constant factor, "$M_0(k)$" is a first metric at a first cycle, "y(k)" is an incoming signal and "a" is an amplitude of the incoming signal, "$M_1(k)$" is a second metric at a first cycle and "$M_{avg}(k)$" is an average of the first metric at the first cycle, the second metric at the first cycle, a third metric at the first cycle and a fourth metric at the first cycle;
a second circuit to compute a second metric defined by $b*\min(M_2(k), M_3(k)-y(k)+a)-M_{avg}(k)$, where "$M_2(k)$" is the third metric at the first cycle and "$M_3(k)$" is the fourth metric at the first cycle;
a third circuit to compute a third metric defined by $b*\min(M_0(k)+y(k)+a, M_1(k))-M_{avg}(k)$; and
a fourth circuit to compute a fourth metric defined by $b*\min(M_2(k)-y(k)+a, M_3(k)-2y(k)+4a)-M_{avg}(k)$.

12. The circuit of claim 11, wherein the first metric is stored within a first analog metric storage element.

13. The circuit of claim 12, wherein the second metric is stored within a second analog metric storage element.

* * * * *